United States Patent
Tasaka et al.

(10) Patent No.: US 9,589,818 B2
(45) Date of Patent: Mar. 7, 2017

(54) APPARATUS FOR LIQUID TREATMENT OF WAFER SHAPED ARTICLES AND LIQUID CONTROL RING FOR USE IN SAME

(71) Applicant: LAM RESEARCH AG, Villach (AT)

(72) Inventors: Koichi Tasaka, Kanagawa (JP); Masaichiro Ken Matsushita, Kanagawa (JP)

(73) Assignee: Lam Research AG, Villach (AT)

( * ) Notice: Subject to any disclaimer, the term of this patent is extended or adjusted under 35 U.S.C. 154(b) by 792 days.

(21) Appl. No.: 13/722,512

(22) Filed: Dec. 20, 2012

(65) Prior Publication Data

US 2014/0174657 A1 Jun. 26, 2014

(51) Int. Cl.
*H01L 21/67* (2006.01)
*H01L 21/687* (2006.01)

(52) U.S. Cl.
CPC .. *H01L 21/67051* (2013.01); *H01L 21/68728* (2013.01); *H01L 21/68735* (2013.01); *Y10T 428/218* (2015.01)

(58) Field of Classification Search
CPC ......... H01L 21/67051; H01L 21/68735; H01L 21/68728; Y10T 428/218
USPC ............ 118/73; 156/345.11, 345.17, 345.18, 156/345.21
See application file for complete search history.

(56) References Cited

U.S. PATENT DOCUMENTS

| | | | |
|---|---|---|---|
| 4,903,717 A | 2/1990 | Sumnitsch | |
| 5,656,082 A * | 8/1997 | Takatsuki | H01L 21/6715 118/416 |
| 5,861,061 A * | 1/1999 | Hayes | G03F 7/162 118/319 |
| 5,879,576 A * | 3/1999 | Wada | B05C 11/08 156/345.21 |
| 6,435,200 B1 * | 8/2002 | Langen | H01L 21/67051 118/52 |
| 6,494,221 B1 * | 12/2002 | Sellmer | H01L 21/67075 134/147 |
| 6,536,454 B2 | 3/2003 | Lindner | |
| 6,586,161 B2 * | 7/2003 | Futase | C23F 1/30 216/83 |

(Continued)

FOREIGN PATENT DOCUMENTS

JP 2009277958 A * 11/2009
JP 2013093407 A * 5/2013
(Continued)

*Primary Examiner* — Rudy Zervigon

(57) ABSTRACT

An apparatus for treating a wafer-shaped article includes a rotary chuck configured to hold a wafer-shaped article of a predetermined diameter such that a surface of the wafer-shaped article facing the rotary chuck is spaced from an upper surface of the rotary chuck. A ring is mounted on the rotary chuck, and includes a first upper surface overlapping an outer peripheral edge of a wafer-shaped article when positioned on the rotary chuck and a second upper surface positioned radially inwardly of the first surface. The second upper surface is elevated relative to the first upper surface, to define an annular gap between the second upper surface and a wafer-shaped article when positioned on the spin chuck that is smaller than a distance between the first upper surface and a wafer-shaped article when positioned on the rotary chuck.

13 Claims, 2 Drawing Sheets

(56) References Cited

U.S. PATENT DOCUMENTS

| | | | | |
|---|---|---|---|---|
| 6,695,922 B2* | 2/2004 | Kitano | G03F 7/16 | 118/315 |
| 6,702,900 B2* | 3/2004 | Yeh | H01L 21/67017 | 118/730 |
| 6,992,014 B2* | 1/2006 | Grant | H01L 21/67253 | 257/E21.251 |
| 7,172,674 B2 | 2/2007 | Engesser | | |
| 7,837,803 B2 | 11/2010 | Hohenwarter | | |
| 8,029,641 B2* | 10/2011 | Baldy | H01L 21/67017 | 156/345.23 |
| 8,056,503 B2* | 11/2011 | Kikuchi | H01J 37/32174 | 118/723 E |
| 8,382,942 B2* | 2/2013 | Hatamura | H01L 21/67069 | 118/725 |
| 9,136,155 B2* | 9/2015 | Kinoshita | H01L 21/6838 | |
| 2001/0054390 A1* | 12/2001 | Halpin | C23C 16/4586 | 118/728 |
| 2002/0050244 A1* | 5/2002 | Engesser | H01L 21/6704 | 118/20 |
| 2002/0148489 A1* | 10/2002 | Langen | H01L 21/67051 | 134/33 |
| 2002/0153676 A1* | 10/2002 | Noguchi | H01L 21/67288 | 279/106 |
| 2003/0015141 A1* | 1/2003 | Takagi | C23C 16/4585 | 118/728 |
| 2003/0017419 A1* | 1/2003 | Futase | C23F 1/30 | 430/311 |
| 2003/0029571 A1* | 2/2003 | Goodman | C23C 16/4581 | 156/345.51 |
| 2003/0079835 A1* | 5/2003 | Kajino | C03C 15/00 | 156/345.11 |
| 2004/0092128 A1* | 5/2004 | Grant | H01L 21/67253 | 438/745 |
| 2004/0094186 A1* | 5/2004 | Ivanov | H01L 21/67051 | 134/32 |
| 2004/0180141 A1* | 9/2004 | Kobayashi | B05D 1/005 | 427/240 |
| 2004/0231711 A1* | 11/2004 | Park | H01L 21/68728 | 134/157 |
| 2004/0234696 A1* | 11/2004 | Hongo | C23C 18/1619 | 427/328 |
| 2004/0241998 A1* | 12/2004 | Hanson | H01L 21/32134 | 438/689 |
| 2005/0074983 A1* | 4/2005 | Shinriki | B08B 7/0035 | 438/785 |
| 2005/0092439 A1* | 5/2005 | Keeton | C23C 16/4585 | 156/345.51 |
| 2005/0178321 A1* | 8/2005 | Nguyen | H01L 21/67051 | 118/52 |
| 2005/0284369 A1* | 12/2005 | Miya | H01L 21/67751 | 118/500 |
| 2006/0045652 A1* | 3/2006 | Miya | H01L 21/6838 | 414/1 |
| 2008/0196835 A1* | 8/2008 | Baldy | H01L 21/67017 | 156/345.23 |
| 2008/0223412 A1* | 9/2008 | Lee | H01L 21/67051 | 134/33 |
| 2009/0181546 A1* | 7/2009 | Katoh | H01L 21/67063 | 438/745 |
| 2009/0235867 A1* | 9/2009 | Fujikawa | C30B 25/12 | 118/728 |
| 2009/0277379 A1* | 11/2009 | Ohmi | G03F 7/162 | 118/302 |
| 2011/0059242 A1* | 3/2011 | Brugger | G03F 7/162 | 427/240 |
| 2011/0120366 A1* | 5/2011 | Higashi | C23C 16/4585 | 117/94 |
| 2011/0151675 A1* | 6/2011 | Frank | H01L 21/67051 | 438/748 |
| 2011/0262115 A1* | 10/2011 | Yokouchi | H01L 21/324 | 392/407 |
| 2012/0018940 A1* | 1/2012 | Kumnig | H01L 21/68728 | 269/225 |
| 2013/0011225 A1* | 1/2013 | Goodman | H01L 21/67092 | 414/225.01 |
| 2013/0048607 A1* | 2/2013 | Matsushita | H01L 21/67028 | 216/83 |
| 2013/0127102 A1* | 5/2013 | Kinoshita | H01L 21/6838 | 269/20 |
| 2013/0203269 A1* | 8/2013 | Yokouchi | H01L 21/26 | 438/795 |
| 2014/0065295 A1* | 3/2014 | Emoto | B05D 1/005 | 427/8 |
| 2014/0127908 A1* | 5/2014 | Okutani | H01L 21/02068 | 438/694 |
| 2014/0174657 A1* | 6/2014 | Tasaka | H01L 21/67051 | 156/345.23 |

FOREIGN PATENT DOCUMENTS

| | | |
|---|---|---|
| WO | 2004/084278 | 9/2004 |
| WO | 2011/073840 | 6/2011 |

* cited by examiner

APPARATUS FOR LIQUID TREATMENT OF WAFER SHAPED ARTICLES AND LIQUID CONTROL RING FOR USE IN SAME

BACKGROUND OF THE INVENTION

1. Field of the Invention

The invention relates to an apparatus for liquid treatment of wafer-shaped articles, and a liquid control ring for use in such apparatus.

2. Description of Related Art

Liquid treatment includes both wet etching and wet cleaning, wherein the surface area of a wafer to be treated is wetted with a treatment liquid and a layer of the wafer is thereby removed or impurities are thereby carried off. A device for liquid treatment is described in U.S. Pat. No. 4,903,717. In this device the distribution of the liquid may be assisted by the rotational motion imparted to the wafer.

Single wafer wet processing of semiconductor wafers typically proceeds through a series of process modules, each of which contains a group of spin chucks such as that described in the above-referenced U.S. Patent. One typical process stage is referred to as "bevel etch", and involves etching the back side of a silicon wafer as well as the outer periphery of the front or device side of the wafer. Etching of the device side is to a controlled extent of only a few millimeters at the outer periphery of the wafer.

A spin chuck adapted to perform bevel etching of semiconductor wafers is described in commonly-owned U.S. Pat. No. 7,172,674, and certain aspects of that spin chuck are illustrated in present FIGS. 1 and 2. As shown in FIG. 1, a chuck 11 supports a wafer W by gas flow in the direction of the arrows G, according to the Bernoulli principle. Thus, pins 53 restrain the wafer W laterally, whereas the wafer is held to the chuck by the counterbalancing pressures created by the gas flow beneath the wafer.

Chuck 11 is equipped with a ring 2 whose upper surface is spaced from the underside of wafer W by a defined small gap 15 of axial extent g. As shown in FIG. 2, as etching liquid L is dispensed onto the upwardly facing back side of wafer W, it also flows around the edge of wafer W and is drawn into gap 15 by capillary action. Ingress of etching liquid L halts at the radially inner edge of ring 15, where a meniscus is formed. The radial extent c of etching effected on the device or downwardly facing side of wafer W is therefore defined and limited by the extent of overlap b between wafer W and ring 15.

While such a device can form a highly accurate bevel edge, the process window within which optimum results are achieved is relatively narrow. Factors potentially affecting the quality and uniformity of the bevel etch, and its consistency from one wafer to the next, include the nature of the material to be removed from the wafer surface, the composition and physical properties of the etching liquid, the process temperature, the size of the gap 15, the diameter of the wafer being processed, and the speed of rotation of the chuck. For example, the capillary gap could be filled, such that the liquid stops there and does not flow inwardly. In such a case the liquid is not replaced or renewed during processing.

During single wafer edge etching processing, the etching area in practice is often not uniform at edge of wafer. Out of spec or off-center edge bead removal (EBR) can result in several different process-related issues; for example, if the EBR width is too narrow, edge grippers on process tools can touch the photoresist and cause it to crack and flake off, causing contamination. If the edge exclusion is too wide, there will be less surface area available for chip formation.

It would therefore be desirable to provide a method and apparatus for performing bevel etch with high accuracy and reproducibility over a broader process window, especially for relatively wider extents of edge etching. However, existing technology has limitations for controlling this range.

SUMMARY OF THE INVENTION

Thus, in one aspect, the present invention relates to an apparatus for treating a wafer-shaped article, comprising a rotary chuck configured to hold a wafer-shaped article of a predetermined diameter such that a surface of the wafer-shaped article facing the rotary chuck is spaced from an upper surface of the rotary chuck. A ring is mounted on the rotary chuck, the ring comprising a first upper surface overlapping an outer peripheral edge of a wafer-shaped article when positioned on the rotary chuck and a second upper surface positioned radially inwardly of the first surface. The second upper surface is elevated relative to the first upper surface, to define an annular gap between the second upper surface and a wafer-shaped article when positioned on the spin chuck that is smaller than a distance between the first upper surface and a wafer-shaped article when positioned on the rotary chuck. The ring furthermore comprises a lower surface that is spaced from a body of the rotary chuck.

In preferred embodiments of the apparatus according to the present invention, the rotary chuck comprises a circular series of pins that limit lateral displacement of a wafer-shaped article when positioned on the rotary chuck.

In preferred embodiments of the apparatus according to the present invention, the ring comprises openings through which pass the circular series of pins.

In preferred embodiments of the apparatus according to the present invention, the second surface is substantially uniplanar, and the ring is mounted on the chuck such that the annular gap is substantially constant.

In preferred embodiments of the apparatus according to the present invention, the first surface comprises an inclined or vertical surface extending from a radially outer edge of the second surface to a radially inner edge of a lower portion of the first surface.

In preferred embodiments of the apparatus according to the present invention, the ring is secured to the rotary chuck by bolts passing through openings formed in the lower portion of the first surface.

In preferred embodiments of the apparatus according to the present invention, the second surface has a substantially constant radial extent in a range of 0.75-4 mm, preferably 1-3 mm, and more preferably 1-2 mm.

In preferred embodiments of the apparatus according to the present invention, the rotary chuck comprises gas discharge openings positioned and oriented so as to permit a wafer-shaped article positioned on the rotary chuck to be supported by a gas cushion according to Bernoulli's principle.

In preferred embodiments of the apparatus according to the present invention, the rotary chuck comprises gas discharge openings positioned and oriented so as to permit a wafer-shaped article positioned on the rotary chuck to be elevated relative to the ring.

In another aspect, the present invention relates to a ring for use in an apparatus for treating wafer-shaped articles, the ring comprising a first upper surface and a second upper surface positioned radially inwardly of the first surface. The second upper surface is substantially uniplanar and has a substantially constant radial extent. The first upper surface comprises a flat annular portion spaced from the second surface both radially and axially of the ring, and an inclined or vertical portion extending between the flat annular portion and the second upper surface.

In preferred embodiments of the ring according to the present invention, the ring has openings formed in the flat annular portion to permit passage of pins of a rotary chuck on which the ring is to be mounted.

In preferred embodiments of the ring according to the present invention, the ring has openings formed in the flat annular portion to permit passage of bolts to fasten the ring onto a rotary chuck on which the ring is to be mounted.

In preferred embodiments of the ring according to the present invention, the substantially constant radial extent in a range of 0.75-4 mm, preferably 1-3 mm, and more preferably 1-2 mm.

In preferred embodiments of the ring according to the present invention, the ring has an innermost diameter less than 300 mm, and an outermost diameter greater than 300 mm. In preferred embodiments of the ring according to the present invention, In preferred embodiments of the ring according to the present invention, the ring has an innermost diameter less than 450 mm, and an outermost diameter greater than 450 mm.

In preferred embodiments of the ring according to the present invention, the second upper surface is perpendicular to an axis of symmetry of the ring.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

The present inventors studied the relationship between the extent of the gap g between the conventional capillary ring 52 and the lower surface of the wafer W (see FIG. 2) to the extent c of the peripheral area of the wafer W to be treated, as well as to the speed of rotation of the spin chuck 11. In general, as the radial extent c of the area to be treated increases, a smaller gap g is required with the conventional capillary ring. The relationship is also somewhat dependent upon the rotation speed of the rotary chuck 11, in that at higher rpm the process liquid has less tendency to travel radially inwardly of the gap g to the full extent, and hence an even smaller gap g might be required for satisfactory performance at higher rpm.

However, it is difficult to achieve consistent and accurate edge treatment for such relatively small gaps g, which, depending upon the radial extent c to be treated, may be as small as a tenth of a millimeter or less.

Figure 3:
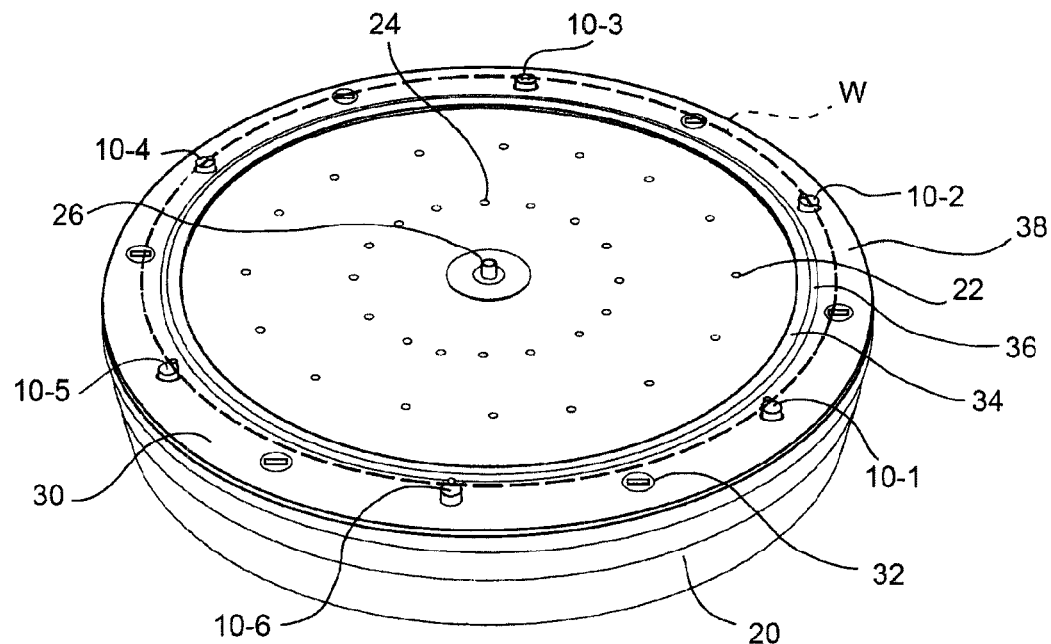
FIG. 3 is a perspective view from above of a chuck according to a first embodiment of the invention, with a wafer in position as indicated in broken line.
Figure 4:
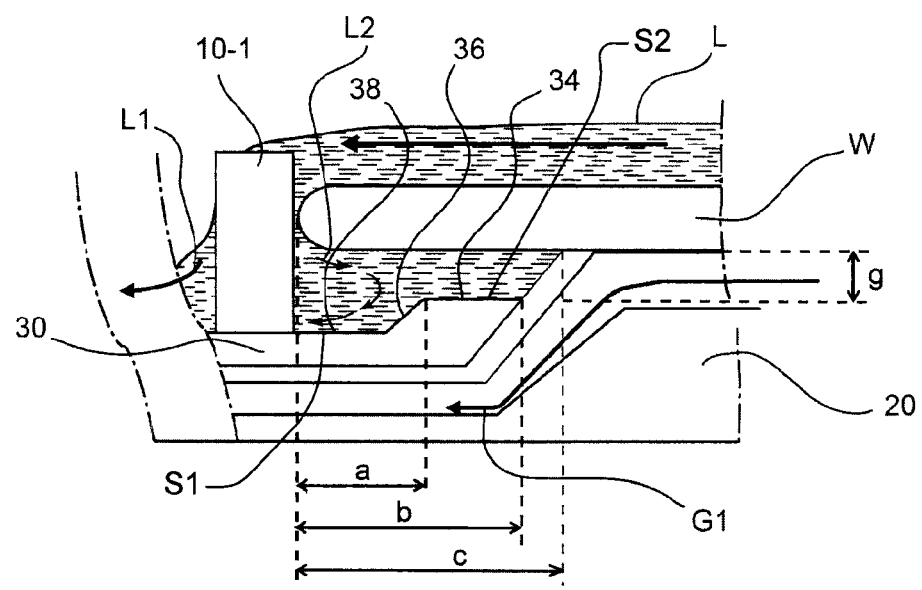
FIG. 4 is a detail similar to that of FIG. 2, of the embodiment of FIG. 3.

Based on these studies, the present inventors designed a new ring configuration, a preferred embodiment of which is illustrated in FIGS. 3 and 4. In FIG. 3, spin chuck 20 holds a wafer W thereon in a predetermined orientation, which is preferably such that the major surfaces of disposed horizontally or within ±20° of horizontal. Spin chuck 20 may for example be a chuck that operates according to the Bernoulli principle, as described for example in U.S. Pat. No. 4,903,717.

To that end, spin chuck 20 includes a series of gas discharge outlets 22, which are positioned and oriented so as to direct a flow of gas radially outwardly of the chuck 20, to provides a dynamic gas cushion beneath the wafer W. Openings 22 communicate with a gas supply, typically nitrogen gas, in a conventional manner.

Chuck 20 also includes a series of pins, which in this embodiment are six in number, designated 10-1 through 10-6. Pins 10-1 to 10-6 prevent the wafer from sliding laterally off the chuck. The upper portions of gripping pins 10-1 to 10-6 may also be configured so as to provide subjacent support for wafer W, and thus the chuck need not operate according to the Bernoulli principle, although in such case it may still be preferred to provide a radially outward gas flow beneath wafer W so as to limit ingress of treatment fluid. Each pin comprises an uppermost portion that extends vertically from the cylindrical pin base, generally along an axis that is offset in relation to the rotation axis of the cylindrical pin base.

Pins 10-1 to 10-6 project upwardly through holes formed in a ring 30, which will be described in greater detail below. Ring 30 is mounted to the chuck 1 by a series of bolts 32, with one bolt 32 preferably being located between each pair of gripping pins 10-1 to 10-6.

Pins 10-1 to 10-6 are conjointly rotated about their cylindrical axes by a ring gear (not shown) that is in simultaneous meshing engaging with the toothed bases all of the pin assemblies, as described for example in U.S. Pat. No. 4,903,717. The eccentric upper contact portions are thus moved in concert between a radially inner position in which a wafer W is contacted at its edge, to a radially outer open position in which the wafer W is released. Pins 10-1 to 10-6 are evenly distributed about the periphery of spin chuck 1, with at least three and preferably six such pins 10 being provided.

Chuck 20 also includes a central nozzle 26 which may be used to dispense a treatment or rinse liquid onto the underside of wafer W, and an inner set of gas discharge nozzles 24, which are positioned and configured so as to act as a lifting mechanism to raise the wafer W relative to chuck 20 and ring 30, as described for example in U.S. Pat. No. 7,172,674.

Although not shown in the figures, the spin chuck may be surrounded by a process chamber, which may be a multi-level process chamber as described in commonly-owned U.S. Pat. No. 7,837,803 (corresponding to WO 2004/084278). The spin chuck can be positioned at the selected level by moving the chuck axially relative to the stationary surrounding chamber, or by moving the surrounding chamber axially relative to the axially-stationary chuck, as described in connection with FIG. 4 of U.S. Pat. No. 6,536,454.

Figure 1:
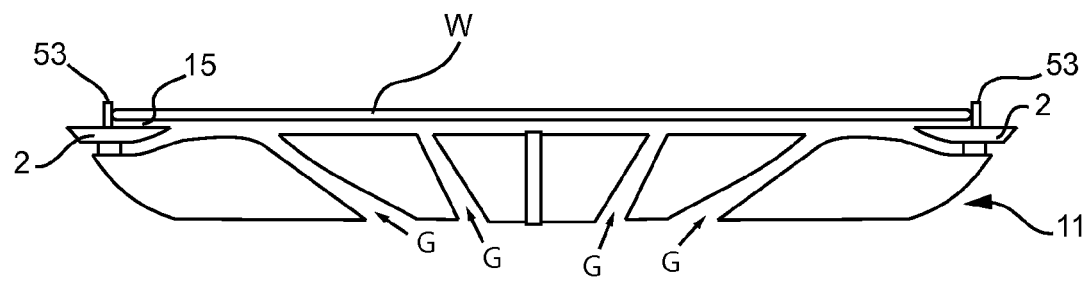
FIG. 1 is a schematic side view of a prior art spin chuck for performing a bevel etch on a semiconductor wafer.
Figure 2:
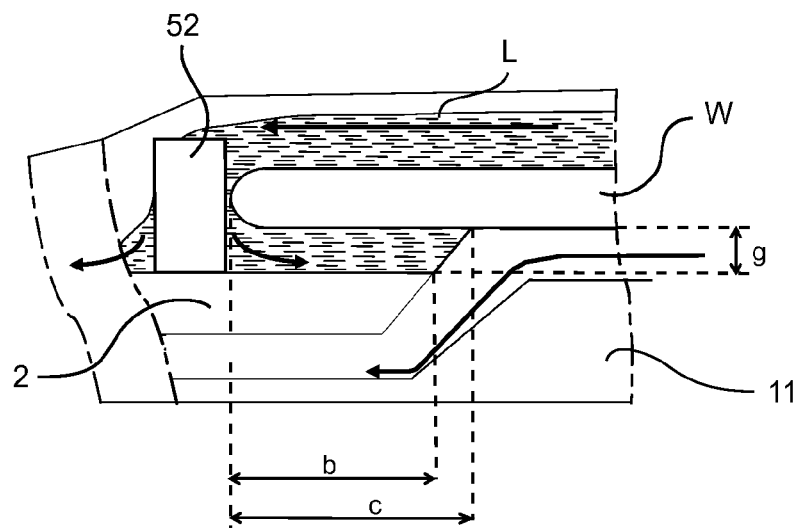
FIG. 2 is a detail of the capillary ring of the chuck of FIG. 1.

Turning now to FIG. 4, the configuration of ring 30 of this embodiment reflects the inventors' discovery that, to provide edge treatment of a wafer region of radial extent c, it is not necessary that the annular gap between the ring 30 and wafer W of axial extent g be provided all the way to the peripheral edge of the wafer (compare FIG. 2). Instead, the uppermost surface 34 of ring 30 continues to terminate radially inwardly at a distance b from the outermost edge of the wafer; however, that surface 34 terminates radially outwardly well short of the outer edge of the wafer W.

In particular, over the region a denoted in FIG. 4, the ring 30 comprises a first surface S1 including a flat annular surface 38 and a sloped surface 36, which are at a lower axial level than a second surface S2 including surface 34. Although surface 36 is sloped in this embodiment, it may alternatively be a vertical surface. Thus, the radial extent of the liquid held by capillary action within the annular gap g is in this embodiment is the difference between the dimensions a and b. That radial extent is preferably in a range of 0.75-4 mm, more preferably 1-3 mm, and most preferably 1-2 mm.

In practice, it has been found that, with this configuration, a first part L1 of the treatment liquid L dispensed onto the upwardly-facing surface of wafer W will proceed radially outwardly from the upper surface of wafer W; however, a second part L2 of that liquid L will wrap around the wafer edge, notwithstanding the increased distance between surfaces 36 and 38 in relation to the underside and wafer W, and enter into the gap g of reduced radial extent.

This novel ring configuration provides several significant advantages. First, because the radial extent of the capillary gap g is reduced for a given radius of wafer peripheral area to be treated, the axial extent of the gap g is not required to be as small and closely controlled as in the conventional case where the capillary gap extends to the wafer edge. This improves process control and widens the process window. Second, the increased clearance especially between the outer peripheral wafer edge and the lower surface 38, provides improved access for an edge-contact only (ECO) or other gripping mechanism that is utilized when loading wafers onto the chuck and unloading wafers from the chuck.

Also, this higher distance of the ring to the wafer (due to the lower surface 38) enables the liquid not only drawing into the capillary but also to be removed from that area. The liquid in the area above surface 38 can thus be renewed permanently and thus can better treat that peripheral area of the wafer-shaped article. The liquid in the area above surface 34 need not move and instead may be renewed by way of diffusion.

Chucks for wafers currently in commercial production are designed to hold wafers of 200 mm or 300 mm, while preparation for the next generation of wafers of 450 mm is already well underway. Thus, when the chuck and ring described above are designed for use on a 300 mm wafer chuck, both the radially inner and outer edges of surface 34 will have a diameter of less than 300 mm, whereas the radially outer edge of surface 38 will have a diameter greater than 300 mm. The corresponding relationships apply to chucks and rings designed to process wafers of other diameters, such as 450 mm.

Similarly, when pins 10-1 through 10-6 are in their radially innermost position, they will circumscribe a circle of essentially the same diameter as the wafer diameter that the chuck 20 and ring 30 are designed to accommodate.

In use, gas supplied through openings 22 flows radially outwardly of chuck 20, as shown by arrow G1 in FIG. 4. To that end, the mounting of ring 30 on chuck 20 via bolts 32 is such that the ring when mounted is nevertheless spaced from the chuck, to permit outward flow of gas G1 beneath the ring 30. This gas flow G1 promotes the liquid flow L2 to wrap around the radially inner edge of ring 30, as indicated at L3, and then to be expelled radially outwardly of the chuck. The gas flow G1 also contributes to forming a stable liquid edge boundary in the region (c-b), which is to say radially inwardly of the ring 30 to the target endpoint of inward edge treatment.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. Apparatus for liquid treatment of a wafer-shaped article, comprising:
    a rotary chuck configured to hold a wafer-shaped article of a predetermined diameter such that a surface of the wafer-shaped article facing the rotary chuck is spaced from an upper surface of the rotary chuck;
    a dispenser to dispense a treatment liquid onto the wafer-shaped article; and
    a continuous ring mounted on the rotary chuck, the continuous ring comprising a first continuous upper surface overlapping an outer peripheral edge of the wafer-shaped article when positioned on the rotary chuck and a second continuous upper surface positioned radially inwardly of the first continuous upper surface,
    wherein the second continuous upper surface is elevated relative to the first continuous upper surface, to define an annular gap between the second continuous upper surface and the wafer-shaped article when positioned on the rotary chuck that is smaller than a distance between the first continuous upper surface and the wafer-shaped article when positioned on the rotary chuck, and
    wherein the continuous ring comprises a lower surface that is spaced from and overlies a body of the rotary chuck, thereby to define an annular gas channel between the lower surface of the continuous ring and the body of the rotary chuck.

2. The apparatus according to claim 1, wherein the rotary chuck comprises a circular series of pins that limit lateral displacement of the wafer-shaped article when positioned on the rotary chuck.

3. The apparatus according to claim 2, wherein the ring comprises openings through which pass the circular series of pins.

4. The apparatus according to claim 1, wherein the second continuous upper surface is substantially uniplanar, and wherein the ring is mounted on the chuck such that the annular gap is substantially constant.

5. The apparatus according to claim 1, wherein the first continuous upper surface comprises an inclined or vertical surface extending from a radially outer edge of the second continuous upper surface to a radially inner edge of a lower portion of the first continuous upper surface.

6. The apparatus according to claim 5, wherein the ring is secured to the rotary chuck by bolts passing through openings formed in the lower portion of the first continuous upper surface.

7. The apparatus according to claim 1, wherein the second continuous upper surface has a substantially constant radial extent in a range of 0.75-4 mm.

8. The apparatus according to claim 1, wherein the rotary chuck comprises gas discharge openings positioned and oriented so as to permit the wafer-shaped article positioned on the rotary chuck to be supported by a gas cushion according to Bernoulli's principle.

9. The apparatus according to claim 1, wherein the rotary chuck comprises gas discharge openings positioned and oriented so as to permit the wafer-shaped article positioned on the rotary chuck to be elevated relative to the continuous ring.

10. Apparatus for liquid treatment of a wafer-shaped article, comprising:
   a rotary chuck configured to hold a wafer-shaped article of a predetermined diameter such that a surface of the wafer-shaped article facing the rotary chuck is spaced from an upper surface of the rotary chuck;
   a dispenser to dispense treatment liquid onto an upper surface of the wafer-shaped article; and
   a continuous ring mounted on the rotary chuck, the continuous ring comprising a first continuous upper surface overlapping an outer peripheral edge of the wafer-shaped article when positioned on the rotary chuck and a second continuous upper surface positioned radially inwardly of the first continuous upper surface,
      wherein the second continuous upper surface is elevated relative to the first continuous upper surface, to define an annular gap between the second continuous upper surface and the wafer-shaped article when positioned on the rotary chuck that is smaller than a distance between the first continuous upper surface and the wafer-shaped article when positioned on the rotary chuck, and
   wherein the second continuous upper surface is substantially uniplanar, and wherein the continuous ring is mounted on the chuck such that the annular gap is substantially constant.

11. The apparatus according to claim 1, wherein the rotary chuck comprises a plurality of pins that limit lateral displacement of the wafer-shaped article when positioned on the rotary chuck, wherein the plurality of pins are uniformly spaced around the rotary chuck.

12. The apparatus according to claim 1, wherein the second continuous upper surface has a substantially constant radial extent in a range of 1 to 3 mm.

13. The apparatus according to claim 1, wherein the second continuous upper surface has a substantially constant radial extent in a range of 1 to 2 mm.

* * * * *